(12) United States Patent
Fuchs (10) Patent No.: US 11,043,791 B2
(45) Date of Patent: Jun. 22, 2021

(54) EDGE EMITTING SEMICONDUCTOR LASER AND METHOD OF OPERATING SUCH A SEMICONDUCTOR LASER

(71) Applicant: OSRAM Opto Semiconductors GmbH, Regensburg (DE)

(72) Inventor: Peter Fuchs, Regensburg (DE)

(73) Assignee: OSRAM OLED GMBH, Regensburg (DE)

(*) Notice: Subject to any disclaimer, the term of this patent is extended or adjusted under 35 U.S.C. 154(b) by 1 day.

(21) Appl. No.: 16/612,857

(22) PCT Filed: Jun. 5, 2018

(86) PCT No.: PCT/EP2018/064739
§ 371 (c)(1),
(2) Date: Nov. 12, 2019

(87) PCT Pub. No.: WO2018/224483
PCT Pub. Date: Dec. 13, 2018

(65) Prior Publication Data
US 2020/0203921 A1    Jun. 25, 2020

(30) Foreign Application Priority Data

Jun. 8, 2017 (DE) .......................... 102017112610.4

(51) Int. Cl.
*H01S 5/00* (2006.01)
*H01S 5/028* (2006.01)
(Continued)

(52) U.S. Cl.
CPC .......... *H01S 5/0287* (2013.01); *H01S 5/0282* (2013.01); *H01S 5/32308* (2013.01);
(Continued)

(58) Field of Classification Search
CPC .. H01S 5/0287; H01S 5/32308; H01S 5/4031; H01S 5/0282; H01S 5/3013; H01S 5/0621; H01S 2304/02
See application file for complete search history.

(56) References Cited

U.S. PATENT DOCUMENTS

| 4,951,291 A | 8/1990 | Miyauchi et al. |
| 5,665,637 A | 9/1997 | Chand |

(Continued)

FOREIGN PATENT DOCUMENTS

| CN | 102414944 A | 4/2012 |
| CN | 103701036 A | 4/2014 |

(Continued)

*Primary Examiner* — Kinam Park
(74) *Attorney, Agent, or Firm* — Slater Matsil, LLP (57) ABSTRACT

An edge emitting semiconductor laser and a method for operating an edge emitting semiconductor laser are disclosed. In an embodiment an edge-emitting semiconductor laser includes a semiconductor layer sequence having an active zone configured to generate laser radiation from the material system AlInGaAs, a facet on the semiconductor layer sequence configured to couple-out and/or reflect the laser radiation and a protective layer sequence directly on the facet protecting the facet from damage, the protective layer sequence including a monocrystalline starting layer of a group 12 group 16 material, an intermediate layer of Si and at least one finishing layer consisting essentially of Al, Si and/or Ta and of O and optionally of N, so that the finishing layer is of a different material system than the starting layer and the intermediate layer, wherein the intermediate layer is oxidized on a side facing the finishing layer, and wherein the protective layer is arranged in a direction away from the semiconductor layer sequence in the indicated order.

17 Claims, 3 Drawing Sheets

(51) Int. Cl.
*H01S 5/323* (2006.01)
*H01S 5/40* (2006.01)
*H01S 5/30* (2006.01)

(52) U.S. Cl.
CPC .......... *H01S 5/4031* (2013.01); *H01S 5/3013* (2013.01); *H01S 2304/02* (2013.01)

(56) References Cited

U.S. PATENT DOCUMENTS

| | | | |
|---|---|---|---|
| 5,933,705 | A | 8/1999 | Geels et al. |
| 6,590,920 | B1 | 7/2003 | McElhinney et al. |
| 6,677,618 | B1* | 1/2004 | Horie ............ H01L 33/30 257/59 |
| 7,065,117 | B2 | 6/2006 | Yamanaka |
| 7,338,821 | B2 | 3/2008 | Ressel et al. |
| 8,331,411 | B2 | 12/2012 | Schillgalies et al. |
| 8,369,371 | B1 | 2/2013 | Chin et al. |
| 9,048,630 | B2 | 6/2015 | Stojetz et al. |
| 9,450,375 | B2 | 9/2016 | Kelemen et al. |
| 2002/0146857 | A1 | 10/2002 | Ichihara |
| 2003/0118070 | A1 | 6/2003 | Lim et al. |
| 2004/0190576 | A1 | 9/2004 | Matsuoka et al. |
| 2005/0287693 | A1* | 12/2005 | Ressel ............ H01S 5/028 438/48 |
| 2008/0023688 | A1* | 1/2008 | Johnson ............ H01L 33/06 257/13 |
| 2009/0257466 | A1* | 10/2009 | Eberhard ............ H01L 33/44 372/45.01 |
| 2011/0051767 | A1* | 3/2011 | Kelemen ............ H01S 5/0021 372/45.01 |
| 2016/0079736 | A1* | 3/2016 | Yvind ............ H01S 5/18358 356/450 |
| 2016/0365699 | A1* | 12/2016 | Lell ............ H01S 5/0282 |

FOREIGN PATENT DOCUMENTS

| | | |
|---|---|---|
| CN | 106063058 A | 10/2016 |
| DE | 10221952 A1 | 11/2003 |
| DE | 102008018928 A1 | 10/2009 |
| DE | 102009054912 A1 | 3/2011 |
| EP | 0774809 A1 | 5/1997 |
| EP | 2110904 A1 | 10/2009 |
| JP | 5939082 A | 3/1984 |
| JP | H02114586 A | 4/1990 |
| JP | 09167880 A | 6/1997 |
| JP | 2000174378 A | 6/2000 |
| JP | 2001177180 A | 6/2001 |
| JP | 2002305351 A | 10/2002 |
| JP | 2003198043 A | 7/2003 |
| JP | 2003273466 A | 9/2003 |
| JP | 2012227239 A | 11/2012 |
| KR | 20140127034 A | 11/2014 |

* cited by examiner

EDGE EMITTING SEMICONDUCTOR LASER AND METHOD OF OPERATING SUCH A SEMICONDUCTOR LASER

This patent application is a national phase filing under section 371 of PCT/EP2018/064739, filed Jun. 5, 2018, which claims the priority of German patent application 102017112610.4, filed Jun. 8, 2017, each of which is incorporated herein by reference in its entirety.

TECHNICAL FIELD

An edge-emitting semiconductor laser is specified. In addition, a method of operating such a semiconductor laser is specified.

BACKGROUND

In U.S. Patent Application Publication No. 2009/0257466 A1 an optoelectronic semiconductor laser with a facet passivation is specified.

German Patent Application Publication No. 10 2009 054 912 A1 concerns a passivation of high power laser diodes.

SUMMARY OF THE INVENTION

Embodiments provide a semiconductor laser that has a long service life at high optical powers.

According to at least one embodiment, the semiconductor laser is an edge-emitting laser. This means, for example, that a laser radiation generated during operation is guided essentially perpendicular to a growth direction of a semiconductor layer sequence of the semiconductor laser. A light emitting surface of the semiconductor laser can be aligned parallel or approximately parallel to the growth direction. In particular, a resonator path in the semiconductor laser runs perpendicular to the growth direction.

According to at least one embodiment, the semiconductor layer sequence is configured to generate the laser radiation. For this purpose, the semiconductor layer sequence preferably has one or more active zones. In at least one active zone, the laser radiation is generated via charge carrier recombination, i.e., electroluminescence.

The semiconductor layer sequence is preferably based on a III-V compound semiconductor material. For example, the semiconductor material is a nitride compound semiconductor material such as $Al_nIn_{1-n-m}Ga_mN$ or a phosphide compound semiconductor material such as $Al_nIn_{1-n-m}Ga_mP$ or an arsenide compound semiconductor material such as $Al_nIn_{1-n-m}Ga_mAs$ or such as $Al_nGa_mIn_{1-n-m}As_kP_{1-k}$, where in each case $0 \leq n \leq 1$, $0 \leq m \leq 1$ und $n+m \leq 1$ as well as $0 \leq k < 1$ holds. Preferably for at least one layer or for all layers of the semiconductor layer sequence $0 < n \leq 0.8$, $0.4 \leq m < 1$ and $n+m \leq 0.95$ and $0 < k \leq 0.5$ holds. The semiconductor layer sequence may contain dopants and additional components. For the sake of simplicity, however, only the essential components of the crystal lattice of the semiconductor layer sequence, i.e., Al, As, Ga, In, N or P, are given, even if these may be partially replaced and/or supplemented by small quantities of other substances.

Preferably, the semiconductor layer sequence is based on the AlInGaAs material system, as defined above.

According to at least one embodiment, the semiconductor laser has at least one facet on the semiconductor layer sequence. The facet is configured for coupling-out and/or reflection of the laser radiation. In particular, there are two facets on the semiconductor layer sequence on opposite side surfaces that define a resonator for the laser radiation.

According to at least one embodiment, the semiconductor laser contains one or more protective layer sequences. The at least one protective layer sequence is configured to protect the facet from damage. The protective layer sequence is preferably located directly on the facet. It is possible that a sequence of protective layers is applied to each facet that is configured to couple out and/or reflect the laser radiation.

According to at least one embodiment, the protective layer sequence has a starting layer. The starting layer is preferably a monocrystalline layer. In particular, the starting layer is an unstructured, continuous layer produced with a constant thickness. For example, the starting layer is produced by molecular beam epitaxy, MBE for short.

According to at least one embodiment, the starting layer is located directly on the facet of the semiconductor layer sequence. Thus the starting layer may touch the semiconductor layer sequence directly.

According to at least one embodiment, the protective layer sequence comprises an intermediate layer. The intermediate layer is further away from the facet than the starting layer. The intermediate layer comprises or consists of at least one Group 14 material of the Periodic Table. In particular, the intermediate layer has a sublayer consisting of exactly one Group 14 material. The intermediate layer is produced, for example, by sputtering.

According to at least one embodiment, the protective layer sequence comprises a finishing layer. The finishing layer is further away from the facet than the starting layer and the intermediate layer.

According to at least one embodiment, the finishing layer comprises or consists of one of the following material classes: Nitride, oxide, oxynitride.

According to at least one embodiment, the starting layer, the intermediate layer and the finishing layer are made of materials from different material systems. Different material systems mean, for example, that different main material components are present. The main material components are, in particular, the essential, crystal-forming components of the respective material. In particular, the starting and finishing layers are free of Group 14 material. This means that a Group 14 material of the periodic table is preferentially present in the starting layer and/or the finishing layer in concentrations of impurities at most. Furthermore, this means in particular that the starting layer is not an oxide, nitride or oxynitride. In particular, the starting layer is a sulphide, selenide or telluride.

In at least one embodiment, the edge-emitting semiconductor laser comprises a semiconductor layer sequence having an active zone for generating laser radiation. A facet is formed at the semiconductor layer sequence for the coupling-out and/or reflection of the laser radiation. Directly on the facet there is a protective layer sequence to protect the facet from damage. The protective layer sequence comprises, in the direction away from the semiconductor layer sequence, a monocrystalline starting layer, an intermediate layer with at least one Group 14 material and at least one finishing layer of a nitride, oxide or oxynitride. The starting layer, the intermediate layer and the finishing layer are manufactured from mutually different material systems.

The semiconductor laser described here is based in particular on the idea that the intermediate layer protects the starting layer from contamination from the finishing layer. This results in a particularly long service life of the semiconductor laser. The semiconductor laser is preferably a near infrared laser with a high optical output power in the range of several watts.

Mirrors or resonator mirrors of edge-emitting semiconductor lasers are typically formed by plane-parallel facets of a semiconductor crystal which is split along crystal planes. During the operation of such lasers with high optical powers, a gradual degradation of the semiconductor material takes place in the area of the mirrors. Degradation is driven in particular by heating of the facet area due to absorption and non-radiative recombination of charge carriers.

The increased temperature at the facet leads to an adverse reduction of the band gap and a progressive material change, especially oxidation, of the facets and further defect formation in the crystal. This further increases absorption and non-radiative recombination. This in turn leads to greater heating, which can generate more material defects, resulting in increased absorption and heating. The reduction of the band gap also results in a current concentration and increased absorption of photons at the facet, which further intensifies the heating, resulting in a stronger reduction of the band gap with increasing current concentration.

If the laser facet is not sufficiently stabilized, this self-reinforcing aging process usually leads abruptly to catastrophic optical damage (COD). This damage is caused in particular by rapid overheating and melting of the semiconductor material, as a result of which the semiconductor laser is destroyed. This mechanism limits the maximum optical power at which the semiconductor laser can be operated during the required service life.

The absorption of laser light by surface states on the semiconductor facet generated by cleaving plays a large part in the facet degradation. In order to prevent this absorption, open bonds on the surface of the facet, which lead to the absorption of laser radiation, may be saturated and thus optically passivated. It is important to select the material that is applied directly to the cleaved semiconductor facet. This material directly on the semiconductor facet is formed by the starting layer.

In the simplest case, the starting layer is an amorphous layer that is applied by physical deposition such as sputtering and can already lead to an increase in the service life of edge-emitting semiconductor lasers. However, an amorphous layer is not sufficient for high laser powers and thus high facet loads. Therefore, the starting layer of the semiconductor laser is grown monocrystalline, especially by molecular beam epitaxy. This enables an improved bonding of the material of the starting layer to the surface atoms of the semiconductor crystal and thus an improved saturation of open bonds.

Following this monocrystalline layer, one or more amorphous dielectric layers corresponding to the finishing layer are usually applied immediately as a barrier, especially against moisture from the environment, and to adjust the desired facet reflectivity. The materials for the finishing layer are preferably transparent in the wavelength range of the laser radiation in order to avoid absorption of laser radiation.

With the semiconductor laser described here, the intermediate layer is additionally inserted, which is preferably located directly between the starting layer and at least one finishing layer. This significantly slows down the ageing of the semiconductor facet and considerably increases the service life of the semiconductor laser. A particular effect of the intermediate layer can be that mechanical tensions between the starting layer and the finishing layer are reduced, which results in improved adhesion and stability.

Furthermore, the intermediate layer can be used to prevent diffusion of substances from the environment, in particular moisture, as well as contaminations in the finishing layer, through the starting layer and into the semiconductor material.

Furthermore, the application of the intermediate layer to the starting layer enables effective saturation of the surface conditions of the preferably monocrystalline starting layer. This prevents the formation of states within the energy range of the band gap of the starting layer, whereby such states can absorb laser light and thus lead to heating and degradation of the facet.

Such contaminations, which diffuse through the starting layer, can lead to absorbent crystal defects. Such contaminations are mainly caused by the manufacturing process, such as the unintentional introduction, also known as sputtering-in, of materials from the sputtering system, for example from the ion beam source and the walls of a sputter chamber. In addition, contamination may also occur to a small extent due to impurities in the starting materials used.

A layer of a group 14 material such as silicon only a few nm thick has proven to be an effective intermediate layer. Despite the comparatively high absorption of the intermediate layer at the wavelength of the laser radiation, especially compared to the materials of the starting layer and the finishing layer, the service life of the semiconductor laser is surprisingly significantly increased. Due to the absorption, however, the intermediate layer should be thin.

In a less preferred configuration, it is possible that the intermediate layer is formed of carbon or contains carbon as the main component. In this case, the intermediate layer is preferably not present as a diamond layer.

According to at least one embodiment, the starting layer is made of (group 12)(group 16) material. Group 12 material is in particular zinc or cadmium. Group 16 material is in particular sulphur, selenium or tellurium. The starting layer of ZnS or ZnSe is preferred.

According to at least one embodiment, the intermediate layer is made of silicon, germanium, silicon oxide and/or germanium oxide. In particular, the intermediate layer is a layer of silicon and a silicon oxide such as silicon dioxide. In the intermediate layer there is at least or exactly one sublayer consisting of a Group 14 material. For the intermediate layer, only exactly one Group 14 material is deposited, which then partially oxidizes, so that one or two Group 14 oxide sublayers are preferably formed. "Consisting of" means here and in the following, in particular, that impurities with a concentration not exceeding $10^{19}$ 1/cm or $10^{18}$ 1/cm are present.

According to at least one embodiment, the at least one finishing layer is an oxide, nitride or oxynitride with aluminum, silicon and/or tantalum. In particular, the finishing layer or one of the finishing layers or all finishing layers is made of aluminum oxide, silicon nitride, silicon oxide, tantalum oxide, aluminum nitride, aluminum oxynitride and/or silicon oxynitride. The finishing layer of $Al_2O_3$ is preferred. If there are several finishing layers, they can be made of different materials. However, all finishing layers made of the same material are preferred.

According to at least one embodiment, the finishing layer is an amorphous layer. The finishing layer is produced in particular by sputtering.

According to at least one embodiment, the finishing layer is slightly contaminated. Preferably, the impurities, taken together, are present in a concentration not exceeding $10^{16}$ $1/cm^3$ or $10^{19}$ $1/cm^3$ or $10^{21}$ $1/cm^3$. The impurities are formed in particular from metals from the sputtering system such as Fe, Cr, Mo, Ni and/or Ti. Contamination C may also occur.

According to at least one embodiment, the intermediate layer is oxidized on a side facing the finishing layer. In other words, it is possible that the intermediate layer is oxidized from the finishing layer. In particular, oxygen from the finishing layer is used. For example, aluminum oxide or excess oxygen is consumed in the finishing layer, so that a silicon oxide or germanium oxide is formed in the intermediate layer. Oxidation preferentially does not penetrate the intermediate layer completely, so that part of the intermediate layer remains as a silicon partial layer or germanium partial layer. Over the operating time of the semiconductor laser, for example, the interlayer is oxidized to at least 20% or 40% and/or to at most 80% or 60% of the original thickness of the interlayer immediately after fabrication.

According to at least one embodiment, the interlayer has a thickness of at least 0.1 nm or 0.2 nm or 1 nm or 2 nm or 3 nm. Alternatively or additionally, the thickness of the interlayer does not exceed 50 nm or 20 nm or 10 nm or 6 nm or 4 nm. The preferred thickness of the intermediate layer is between 1.5 nm and 3.5 nm.

According to at least one embodiment, the starting layer has a thickness of at least 10 nm or 20 nm. Alternatively or additionally, the thickness of the starting layer does not exceed 200 nm or 100 nm or 60 nm.

According to at least one embodiment, the thickness of the initial layer is at least 5% or 10% or 15% of a thickness of the finishing layer. Alternatively or additionally, the thickness of the initial layer does not exceed 60% or 40% or 30% of the thickness of the finishing layer.

According to at least one embodiment, the finishing layer has a thickness of at least 15 nm or 25 nm or 50 nm. Alternatively or additionally, the thickness of the top layer shall not exceed 1 µm or 0.5 µm, or 250 nm.

According to at least one embodiment, the starting layer is thicker than the intermediate layer. Preferably the thickness of the starting layer exceeds the thickness of the intermediate layer by at least a factor of 3 or 5 or 7 and/or by at most a factor of 20 or 10.

According to at least one embodiment, the protective layer sequence is located on an output side of the semiconductor laser, which is intended for coupling-out the laser radiation. The protective layer sequence can thus be configured as an anti-reflectively acting layer or as an anti-reflective layer. An optical thickness of the total protective layer sequence is preferably $(1+N)\lambda/4$. This applies in particular with a tolerance of at most $\lambda/8$ or $\lambda/16$ or $\lambda/32$, related to the optical thickness.

Optical thickness means that the respective refractive indices of the materials involved have already been taken into account without explicitly appearing in the above formula context. The wavelength is the maximum intensity of the laser radiation and N is an integer $\geq 0$. Preferred is $N=0$ or $N=1$. The reflectivity of such a layer can be 0.1% or less.

A desired deviation from the ideal thickness of an anti-reflective layer of $(1+N)\lambda/4$ can also be used to selectively adjust the reflectivity, in particular to increase it. For example, the reflectivity of the protective layer sequence for the laser radiation is at least 0.5% or 1% and/or at most 10% or 5% or 2%.

According to at least one embodiment, the protective layer sequence is located on a reflection side of the semiconductor laser, which is designed to reflect the laser radiation. This means that the protective layer sequence can be located on or in a resonator mirror of the semiconductor laser. The protective layer sequence is preferably comprised by a Bragg mirror, which forms the resonator mirror. The Bragg mirror is aligned to reflect the laser radiation and preferably has a reflectivity of at least 95% or 98% or 99.5% for the laser radiation.

According to at least one embodiment, the Bragg mirror comprises at least 3 or 4 and/or at most 20 or 12 or 8 or 6 pairs of layers. The pairs of layers each consist of a high refractive layer with a high refractive index and a low refractive layer with a relatively low refractive index for the laser radiation. For example, a refractive index difference between the high refractive index and the low refractive index is at least 0.2 or 0.3 or 0.5 and/or at most 1.5 or 1 or 0.7. The Bragg mirror consisting of four pairs of layers is preferred.

According to at least one embodiment, the Bragg mirror comprises two or more than two types of layer pairs with different material composition. For example, one type of layer pairs is made exclusively of materials that are transparent to laser radiation, and another type of layer pairs in particular has a highly refractive layer of a material that absorbs the laser radiation. For example, the layer pairs of the first type are of aluminum oxide and tantalum oxide or titanium oxide and the layer pairs of the second type are of aluminum oxide and silicon.

According to at least one embodiment there is exactly one starting layer, exactly one intermediate layer and exactly one finishing layer. These layers preferably follow one another in the order mentioned, starting at the facet.

According to at least one embodiment there are M finishing layers and M or M−1 intermediate layers. Here M is an integer with $M\geq 3$ or $M\geq 2$, in particular $M=3$. The finishing layers are preferably each located on opposite sides of an intermediate layer. This means that between two adjacent finishing layers there is an intermediate layer in each case. In addition, an intermediate layer can optionally be located on a side of the finishing layer furthest away from the facet.

According to at least one embodiment, one of the finishing layers is directly on the starting layer. Starting from this finishing layer directly at the starting layer, the remaining finishing layers and intermediate layers follow the protective layer sequence alternately and preferably directly on above the other.

According to at least one embodiment there are J finishing layers and J or J+1 intermediate layers. J is a whole number $\geq 2$ or $\geq 3$. In particular, $J=3$ holds. The intermediate layers and the finishing layers preferably follow each other alternately and/or directly.

According to at least one embodiment, one of the intermediate layers is located directly on the starting layer. Starting from this intermediate layer, the other intermediate layers and finishing layers follow one another alternately and preferably directly, in the direction away from the starting layer.

According to at least one embodiment, the semiconductor laser is configured for an average emission power of the laser radiation of at least 2 W or 4 W or 8 W. The laser radiation can be emitted at an average emission power of at least 2 W or 4 W or 8 W. The laser radiation can be emitted at an average emission power of at least 2 W or 4 W or 8 W. In particular, the average emission power is at least 10 W or 13 W.

According to at least one embodiment, an energy density of at least 2 $MW/cm^2$ or 6 $MW/cm^2$ and/or at most 8 $MW/cm^2$ or 12 $MW/cm^2$ is present, at least temporarily and at least in places, at the facet, on which the protective layer sequence is located, during intended operation of the semiconductor laser. Thus very high energy densities are present at the facet.

According to at least one embodiment, the semiconductor laser is configured to generate near-infrared radiation. The wavelength of maximum intensity of the laser radiation is preferably at least 800 nm or 880 nm or 900 nm and/or at most 1300 nm or 1050 nm or 980 nm. In particular, the wavelength of maximum intensity is around 910 nm.

In addition, an operating method of operating such a semiconductor laser is specified. Features for the semiconductor laser are therefore also disclosed for the method of operating and vice versa.

In at least one embodiment, the at least one intermediate layer is absorbing for the generated laser radiation. In particular, the intermediate layer comprises a material with a band gap smaller than corresponding to the wavelength of the maximum intensity of the laser radiation. An absorption of the laser radiation in the intermediate layer decreases with increasing operating time.

According to at least one embodiment, the at least one intermediate layer, preferably all intermediate layers, is oxidized from a side facing the finishing layer with increasing operating time. Each intermediate layer is preferably assigned to a finishing layer in a one-to-one correspondence.

If there are several finishing layers between which an intermediate layer is placed, it is possible that the oxidation only takes place in the direction of the facet and thus towards the starting layer. Alternatively, in this case the oxidation can take place from both main sides of the intermediate layer, i.e., in the direction toward and away from the starting layer, starting from the respective finishing layer.

According to at least one embodiment, the intermediate layers are only partially oxidized during the intended use of the semiconductor laser. This means that a starting material of the intermediate layer, in particular silicon or alternatively germanium, remains as a preferably continuous and uninterrupted layer in the intermediate layer as at least a thin partial layer even over the operating time of the semiconductor laser. In particular, the intermediate layer is oxidized to a maximum of 80% in relation to its expansion in the direction perpendicular to the starting layer.

In the following, a semiconductor laser described here is explained in more detail with reference to the drawing by means of exemplary embodiments. Same reference signs indicate the same elements in the individual figures. However, there are no references to scale shown, rather individual elements may be exaggeratedly large for a better understanding.

DETAILED DESCRIPTION OF ILLUSTRATIVE EMBODIMENTS

Figure 1:
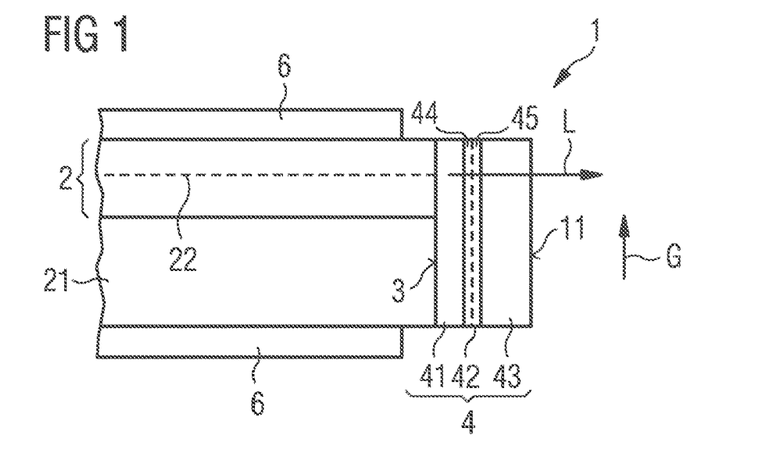
FIGS. 1, 2, 4 and 5 show schematic sectional views of exemplary embodiments of semiconductor lasers.

In FIG. 1 an exemplary embodiment of an edge-emitting semiconductor laser 1 is shown. A semiconductor layer sequence 2 with an active zone 22 for generating a laser radiation L has been grown on a substrate 21. To energize the semiconductor layer sequence 2, two metallizations 6 are attached to the substrate 21 as well as to the semiconductor layer sequence 2. The active zone 22 is oriented perpendicular to a growth direction G of the semiconductor layer sequence.

The semiconductor layer sequence 2 is grown in a wafer composite. A singulation to the semiconductor lasers 1 takes place by breaking for instance, whereby facets 3 are formed at the semiconductor layer sequence 2. In particular, a facet 3 is formed on an output side 11 of the semiconductor laser 1. At the output side 11, the laser radiation L exits the semiconductor laser 1.

A protective layer sequence 4 is located on facet 3 of the output side 11. The protective layer sequence 4 is composed of a starting layer 41, an intermediate layer 42 and a finishing layer 43. These layers 41, 42, 43 follow in the direction away from the facet 3 immediately one above the other. The starting layer 41 directly on the facet 3 passivates the surface states of the semiconductor material of the semiconductor layer sequence 2. The intermediate layer 42 provides adhesion between the starting layer 41 and the finishing layer 43, and the intermediate layer 42 also forms a diffusion barrier. A barrier effect against moisture from an environment of semiconductor laser 1 is achieved by the finishing layer 43.

The semiconductor layer sequence 2 is preferably based on the AlInGaAs material system. The starting layer 41 is preferably a monocrystalline ZnSe layer with a thickness of 25 nm, produced by MBE. The intermediate layer 42 is sputtered in particular from Si with a thickness of approximately 2.5 nm. The finishing layer 43, for example, is an amorphous $Al_2O_3$ layer with a thickness of 112 nm, also produced by sputtering.

After generating the intermediate layer 42 from a material absorbing the laser radiation L, partial oxidation takes place. After some time the intermediate layer 42 is composed of a group 14 sublayer 44 and a group 14 oxide sublayer 45. With increasing operating time of the semiconductor laser 1, the thickness of the group 14 sublayer 44 decreases and accordingly the thickness of the group 14 oxide sublayer 45 increases, whereby, however, the group 14 sublayer 44 is not completely oxidized. As a result, the intermediate layer 42 becomes increasingly transparent to the laser radiation L over the course of time.

The protective layer sequence 4 in total represents an anti-reflective layer for the laser radiation L. The protective layer sequence 4 in total represents an anti-reflective layer for the laser radiation L. A reflectivity of the protective layer sequence 4, for example, is approximately 1%. A wavelength of maximum intensity of the laser radiation L is 910 nm. At other wavelengths of maximum intensity, the thicknesses of the starting layer 41 and/or the finishing layer 43 are to be adjusted accordingly in order to achieve the desired reflectivity.

Figure 2:
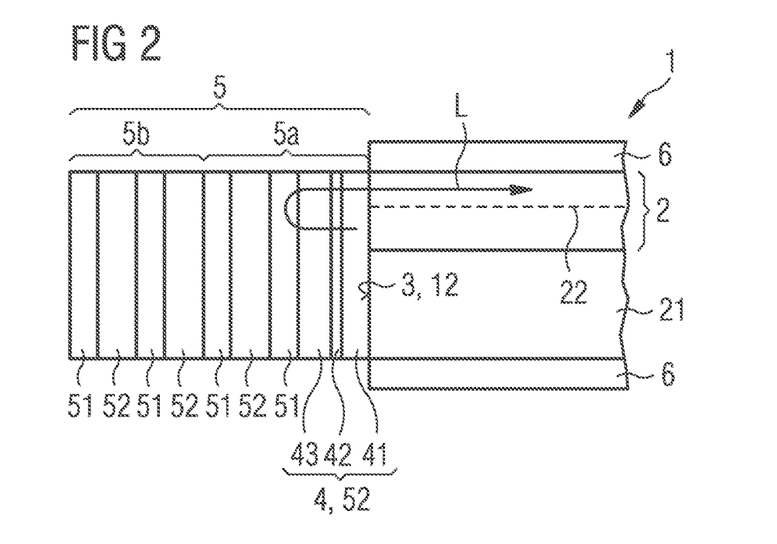

FIG. 2 illustrates another exemplary embodiment of the semiconductor laser 1. The protective layer sequence 4 is located on a reflection side 12 of the semiconductor laser 1, on which the laser radiation L is reflected. For this purpose, the protective layer sequence 4 is a part of a Bragg mirror 5 with alternating successive layers 51 with high refractive index and layers 52 with low refractive index. The layers 51, 52 each have an optical thickness of $\lambda/4$, where $\lambda$ is the wavelength of the maximum intensity of the laser radiation L.

The protective layer sequence 4 forms the layer 52 with a low refractive index closest to the facet 3 of the reflection side 12. The Bragg mirror 5 has two areas 5a, 5b, which are composed of different materials. Each of areas 5*a*, 5*b* preferably has exactly two pairs of layers from layers 51, 52. The further low refractive layer 52 of area 5*a* at the facet 3 is preferably formed by an aluminum oxide layer. The high refractive layers 51 of area 5*a* are preferably realized by tantalum oxide layers or titanium oxide layers. The high refractive layers 51 of area 5*b* are silicon layers, the low refractive layers 52 of area 5*b* are also preferably aluminum oxide layers.

Both facets 3, i.e., both on the output side 11 and on the reflection side 12, are preferably provided with a protective layer sequence 4.

Figure 3:
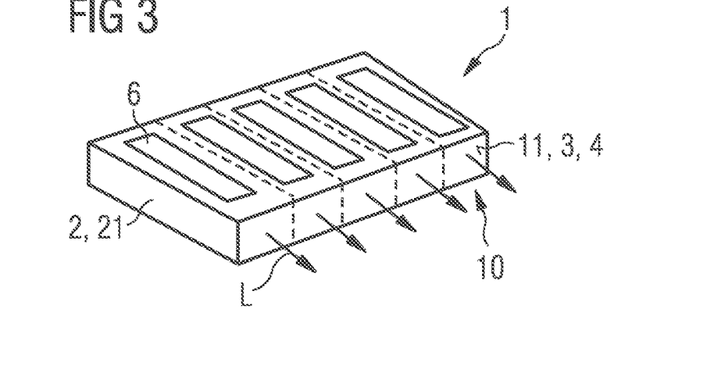
FIG. 3 shows a schematic perspective representation of an exemplary embodiment of a semiconductor laser.

The semiconductor laser 1 according to the exemplary embodiment in FIG. 3 has several emitter units 10. For example, each of the five emitter units 10 is formed by a semiconductor laser 1, as shown in FIG. 1 or 2. The emitter units 10 can be monolithically integrated in the semiconductor layer sequence 2 as well as in the substrate 21, symbolized in FIG. 3 by dashed lines between the emitter units 10. Alternatively, it is possible that the individual emitter units 10 are separated from each other by a gap and/or are mounted on a non-drawn, further carrier.

For example, each of the emitter units 10 is designed to emit laser radiation L of the same wavelength. An optical power of each of the emitter units 10 is preferably at least 10 W. The individual emitter units 10 can be identical in construction.

Figure 4:
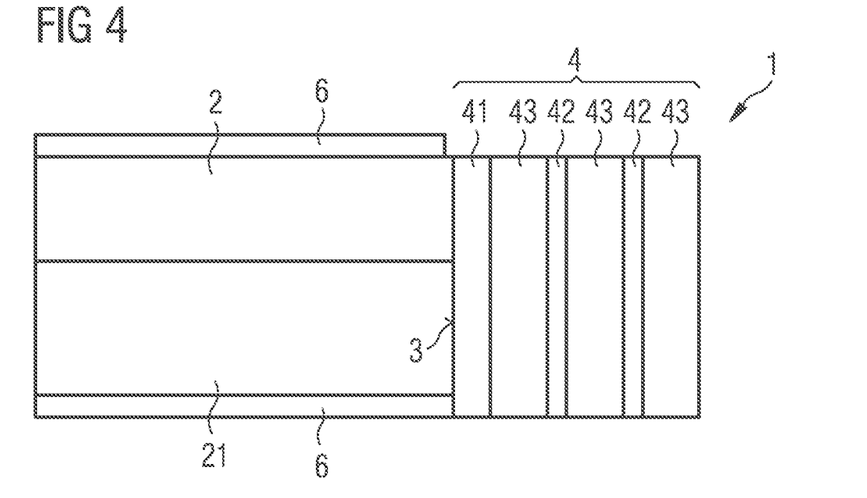

In the exemplary embodiment of FIG. 4, several of the finishing layers 43 are present. Between adjacent finishing layers 43 there is an intermediate layer 2 each. The finishing layers 43 are preferably all of identical construction. The same applies preferentially to the intermediate layers 42. The finishing layer 43 closest to the semiconductor layer sequence 2 follows directly after the starting layer 41.

Since the intermediate layers 42 are made of a material which absorbs the laser radiation L, the intermediate layers 42 are to be chosen very thin. Due to the high beam intensities and the heat development in the protective layer sequence 4, the silicon intermediate layers 42, in particular, are converted into silicon oxide during the operation of the semiconductor laser 1, starting from the associated finishing layers 43, as explained in connection with FIG. 1. This conversion can take place to a large extent already during the first operating minutes of the semiconductor laser 1 and partly also during the generation of the finishing layers 43 as well as the intermediate layers 42. Thus a clearly measurable proportion of the oxidation already takes place during tempering after the coating with the protective layer sequence 40. However, further conversion into silicon oxide takes place on larger time scales. Thus, the absorption through the intermediate layers 42 on a time scale of several 100 operating hours continues to decrease significantly. This means that as the operating time increases, the protective layer sequence 4 becomes more and more transmissive to the laser radiation L.

An improved diffusion barrier can be achieved by using several intermediate layers 42. By oxidizing the intermediate layer 42 from the edges of the intermediate layers 42, each intermediate layer 42, for example, is oxidized to about 60% after several 100 operating hours. The oxidation of the intermediate layers 42 takes place in particular only to a very shallow depth in the range of 1 nm to 2 nm. By using many intermediate layers 42, a good barrier effect can be effectively achieved with an overall low silicon layer thickness. On the other hand, a single, solid and thicker silicon layer would only be oxidized to a considerably smaller extent, which would result in higher absorption losses for the laser radiation L.

Figure 5:
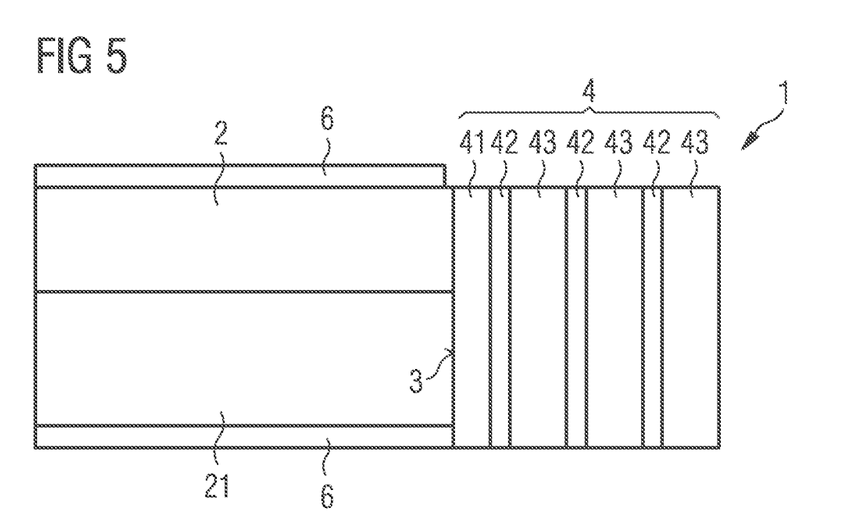

In the exemplary embodiment of FIG. 5, there are several intermediate layers 42 and several finishing layers 43. Starting from the starting layer 41, pairs of intermediate layers 42 and finishing layers 43 follow each other directly and alternately. In particular, the intermediate layer 42 closest to the starting layer 41 improves the adhesion of the finishing layers 43 to the starting layer 41.

As in FIG. 4, in the exemplary embodiment of FIG. 5, it is possible that a further, undrawn intermediate layer is located on the outside of the protective layer sequence 4, facing away from the facet 3, which limits the protective layer sequence 4 to the outside.

Figure 6A:
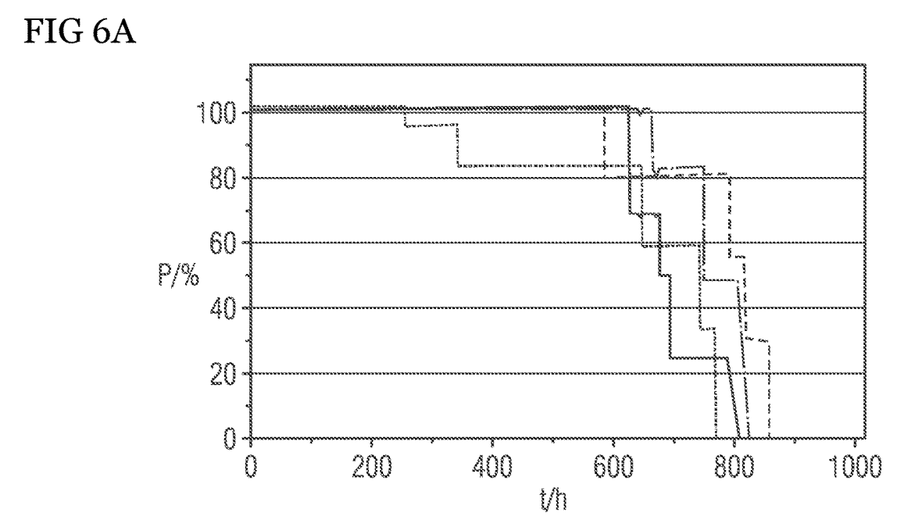
FIGS. 6A and 6B show schematic time curves of an optical output power of semiconductor lasers.
Figure 6B:
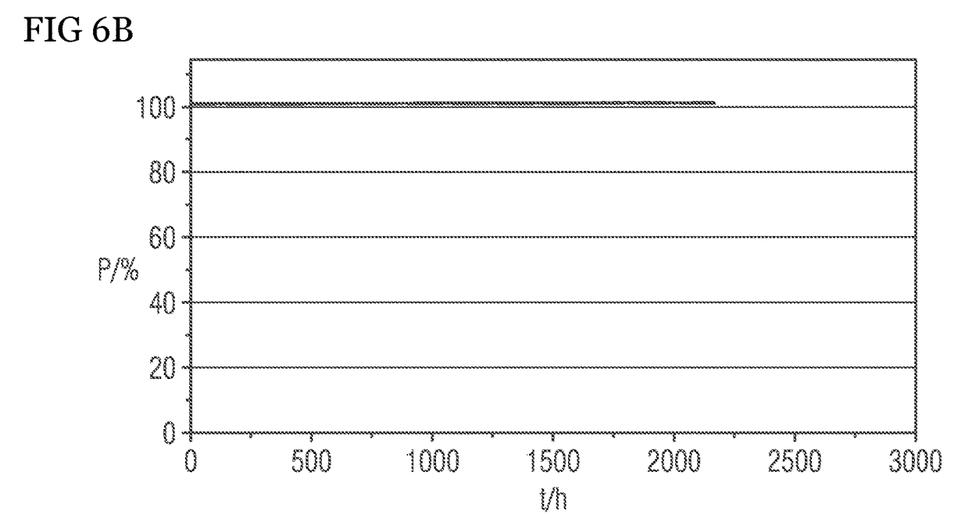

In FIGS. 6A and 6B, a relative optical output power P is plotted in relation to the operating time t. Semiconductor lasers 1 with five emitter units 10 each are used, as shown in FIG. 3. The illustration in FIG. 6B refers to the exemplary embodiment of FIG. 1 with the protective layer sequence 4 described there. FIG. 6A illustrates a reference semiconductor laser in which, however, the intermediate layer 42 is missing, with an otherwise identical structure.

The five emitter units 10, see FIG. 3, are operated with a total current of 62 A, resulting in an optical output power of 65 W at the start of the measurement series. The measurements were carried out at an ambient temperature of 20° C.

According to FIG. 6A, all emitter units 10 failed after about 800 operating hours. FIG. 6A thus shows that this semiconductor laser has a service life of approximately 600 hours. In contrast, FIG. 6B shows that the emitter units do not fail for up to 2170 operating hours. FIG. 6B shows a considerably increased service life of at least 2170 hours due to the intermediate layer 42.

Unless otherwise indicated, the components shown in the figures follow each other directly in the order indicated. Layers that do not touch each other in the figures are preferably spaced apart. As far as lines are drawn parallel to each other, corresponding surfaces preferably are also parallel to each other. Also, unless otherwise indicated, the relative positions of the drawn components to each other are correctly reproduced in the figures.

The invention described here is not restricted to the exemplary embodiments by the description on the basis of the exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

This patent application claims the priority of German patent application 10 2017 112 610.4, the disclosure content of which is hereby incorporated by reference.

The invention claimed is:

1. An edge-emitting semiconductor laser comprising:
   a semiconductor layer sequence comprising an active zone configured to generate laser radiation from the material system AlInGaAs;
   a facet on the semiconductor layer sequence configured to couple-out and/or reflect the laser radiation; and
   a protective layer sequence directly on the facet protecting the facet from damage, the protective layer sequence comprising:
      a monocrystalline starting layer of a group 12 group 16 material;

an intermediate layer of Si; and
at least one finishing layer consisting essentially of Al, Si and/or Ta and of O and optionally of N so that the finishing layer is of a different material system than the starting layer and the intermediate layer,
wherein the intermediate layer is oxidized on a side facing the finishing layer, and
wherein the protective layer sequence is arranged in a direction away from the semiconductor layer sequence in the indicated order.

2. The semiconductor laser according to claim 1, wherein the intermediate layer is of Si and an oxide thereof such that the intermediate layer comprises exactly one sublayer consisting essentially of Si.

3. The semiconductor laser according to claim 2,
wherein the starting layer is of ZnSe or ZnS, and
wherein the finishing layer is of amorphous $Al_2O_3$.

4. The semiconductor laser according to claim 1, wherein the intermediate layer has a thickness between 1 nm and 5 nm inclusive.

5. The semiconductor laser according to claim 1,
wherein the starting layer has a thickness between 10 nm and wo nm inclusive and/or between 10% and 40% inclusive of a thickness of the finishing layer,
wherein the thickness of the finishing layer being between 25 nm and 500 nm inclusive, and
wherein the starting layer being at least 3 times thicker than the intermediate layer.

6. The semiconductor laser according to claim 1, wherein the protective layer sequence is located on an output side of the semiconductor laser for coupling-out the laser radiation so that the protective layer sequence is an anti-reflection layer with an optical thickness of $(1+N)\lambda/4$ and with a tolerance of at most $\lambda/16$, where N is an integer $\geq 0$ and $\lambda$ a wavelength of a maximum intensity of the laser radiation.

7. The semiconductor laser according to claim 1,
wherein the protective layer sequence is located on a reflection side of the semiconductor laser for reflecting the laser radiation, and
wherein the protective layer sequence comprises a Bragg mirror for the laser radiation.

8. The semiconductor laser according to claim 7,
wherein the Bragg mirror comprises between including 3 and 8 pairs of layers of high refractive layers and low refractive layers, and
wherein at least two kinds of layer pairs of different material composition are present.

9. The semiconductor laser according to claim 1, wherein the protective layer sequence exactly comprises exactly one starting layer, exactly one intermediate layer and exactly one finishing layer immediately following one another.

10. The semiconductor laser according to claim 1,
wherein the semiconductor laser comprises M finishing layers and M-1 intermediate layers, M being an integer $\geq 3$,
wherein one of each of the intermediate layers is located directly between two adjacent finishing layers, and
wherein one of the finishing layers is located directly on the starting layer.

11. The semiconductor laser according to claim 1,
wherein the semiconductor laser comprises J finishing layers and J intermediate layers, J being an integer $\geq 2$,
wherein the intermediate layers and the finishing layers each succeed one another directly, and
wherein one of the intermediate layers is located directly on the starting layer.

12. The semiconductor laser according to claim 1, wherein the semiconductor laser is configured to emit an average emission power of the laser radiation of at least 8 W, and wherein an energy density at the facet with the protective layer sequence is at least in places at least 6 $MW/cm^2$.

13. A method for operating an edge-emitting semiconductor laser, wherein the edge-emitting semiconductor laser comprises a semiconductor layer sequence having an active zone for generating laser radiation from the material system AlInGaAs, a facet on the semiconductor layer sequence for coupling-out and/or reflecting the laser radiation and a protective layer sequence directly on the facet to protect the facet from damage, wherein the protective layer sequence comprises a direction away from the semiconductor layer sequence in the following order: a monocrystalline starting layer of a group 12 group 16 material, an intermediate layer of Si, the intermediate layer being oxidized on a side facing a finishing layer, and at least one finishing layer consisting essentially of Al, Si and/or Ta and of O and optionally of N, so that the finishing layer is of a different material system from the starting layer and from the intermediate layer, the method comprising:
absorbing, by the intermediate layer, the laser radiation so that an absorption of the laser radiation in the intermediate layer decreases with increasing operating time.

14. The method according to claim 13, wherein the intermediate layer is oxidized from a side facing the finishing layer with increasing operating time, and wherein the intermediate layer is only partially oxidized.

15. An edge-emitting semiconductor laser comprising:
a semiconductor layer sequence having an active zone configured to generate laser radiation from the material system AlInGaAs;
a facet on the semiconductor layer sequence configured to couple-out and/or reflect the laser radiation; and
a protective layer sequence directly on the facet to protect the facet from damage,
wherein the protective layer sequence comprises a direction away from the semiconductor layer sequence in the following order:
a monocrystalline starting layer of a group 12 group 16 material;
an intermediate layer comprising a group 14 material; and
at least one finishing layer consisting essentially of Al, Si and/or Ta and of O and optionally of N so that the finishing layer is of a different material system from the starting layer and from the intermediate layer.

16. The edge-emitting semiconductor laser according to claim 15, wherein a wavelength of maximum intensity of the laser radiation is at least 80 nm and at most 1050 nm.

17. A method for operating an edge-emitting semiconductor laser, wherein the edge-emitting semiconductor laser comprises a semiconductor layer sequence having an active zone for generating laser radiation from the material system AlInGaAs, a facet on the semiconductor layer sequence for coupling-out and/or reflecting the laser radiation and a protective layer sequence directly on the facet to protect the facet from damage, wherein the protective layer sequence comprises a direction away from the semiconductor layer sequence in the following order: a monocrystalline starting layer of a group 12 group 16 material, an intermediate layer comprising a group 14 material, and at least one finishing layer consisting essentially of Al, Si and/or Ta and of O and optionally of N, so that the finishing layer is of a different material system from the starting layer and from the intermediate layer, the method comprising:

absorbing, by the intermediate layer, the laser radiation so that an absorption of the laser radiation in the intermediate layer decreases with increasing operating time.

* * * * *

UNITED STATES PATENT AND TRADEMARK OFFICE
CERTIFICATE OF CORRECTION

PATENT NO. : 11,043,791 B2  
APPLICATION NO. : 16/612857  
DATED : June 22, 2021  
INVENTOR(S) : Peter Fuchs Page 1 of 1

It is certified that error appears in the above-identified patent and that said Letters Patent is hereby corrected as shown below:

In the Claims

In Claim 5, Column 11; Line 24 delete "wo" insert --10--

In Claim 16, Column 12; Line 51 delete "80 nm" insert --800 nm--

Signed and Sealed this  
Seventh Day of September, 2021

Drew Hirshfeld  
*Performing the Functions and Duties of the*  
*Under Secretary of Commerce for Intellectual Property and*  
*Director of the United States Patent and Trademark Office*